(12) United States Patent
Franceschini

(10) Patent No.: US 11,876,463 B2
(45) Date of Patent: Jan. 16, 2024

(54) BATTERY

(71) Applicant: GQENERGY SRL, Villa Minozzo (IT)

(72) Inventor: Ernesto Franceschini, Villa Minozzo (IT)

(73) Assignee: GQENERGY SRL, Villa Minozzo (IT)

( * ) Notice: Subject to any disclaimer, the term of this patent is extended or adjusted under 35 U.S.C. 154(b) by 861 days.

(21) Appl. No.: 16/960,775

(22) PCT Filed: Jan. 4, 2019

(86) PCT No.: PCT/IB2019/050071
§ 371 (c)(1),
(2) Date: Jul. 8, 2020

(87) PCT Pub. No.: WO2019/138306
PCT Pub. Date: Jul. 18, 2019

(65) Prior Publication Data
US 2020/0336087 A1 Oct. 22, 2020

(30) Foreign Application Priority Data

Jan. 12, 2018 (IT) .................. 102018000000791

(51) Int. Cl.
*H02N 2/18* (2006.01)
*H02N 2/00* (2006.01)
*H10N 30/098* (2023.01)
*H10N 30/857* (2023.01)

(52) U.S. Cl.
CPC .................. *H02N 2/18* (2013.01); *H02N 2/22* (2013.01); *H10N 30/098* (2023.02); *H10N 30/857* (2023.02)

(58) Field of Classification Search
CPC .......... H02N 2/18; H02N 2/22; H02N 11/008; H10N 30/098; H10N 30/857
See application file for complete search history.

(56) References Cited

U.S. PATENT DOCUMENTS

2019/0283379 A1* 9/2019 Lin .................. B32B 15/08

FOREIGN PATENT DOCUMENTS

GB 2521193 A 6/2015

OTHER PUBLICATIONS

Xue et al., "Flexible Self-Charging Power Cell for One-Step Energy Conversion and Storage" Advanced Energy Materials, pp. 1614-6832, vol. 4, No. 5 (Oct. 2013).

* cited by examiner

*Primary Examiner* — Emily P Pham
(74) *Attorney, Agent, or Firm* — Browdy and Neimark, PLLC

(57) ABSTRACT

An electric generator (10) that comprises:—a first layer (11) based on a polyvinyl polymer;—a second layer (12) made of graphite or graphene in contact with the first layer (11);—a first electrical contact (13) connected to the first layer (11); and—a second electrical contact (14) connected to the second layer (12).

12 Claims, 1 Drawing Sheet

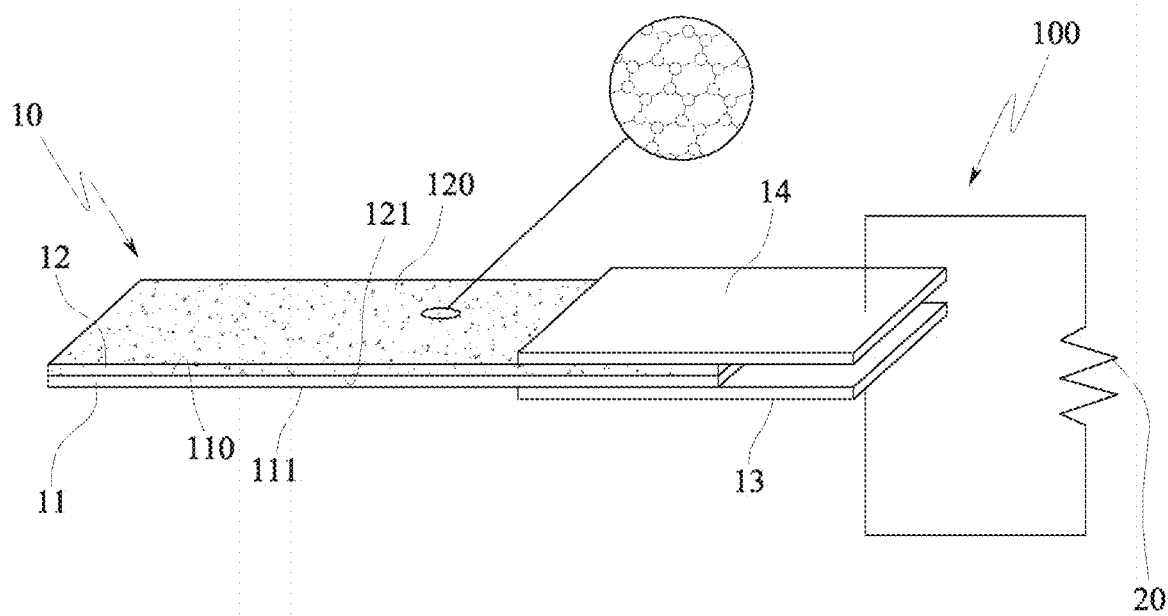
FIG.1
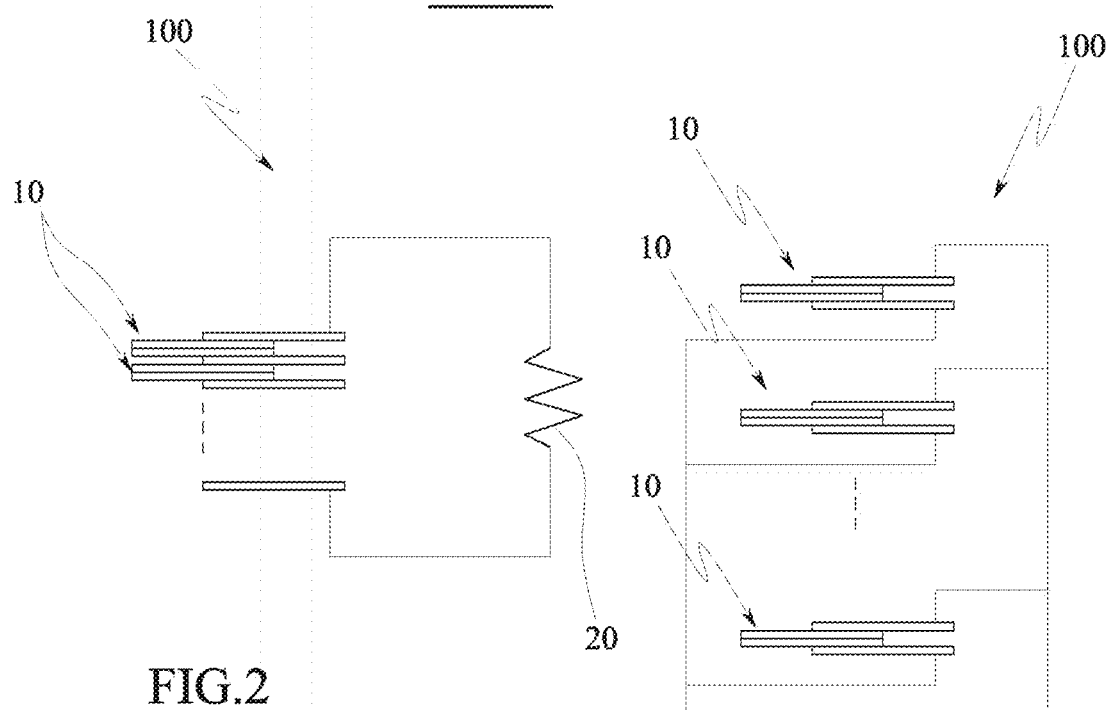
FIG.2
FIG.3

BATTERY

TECHNICAL FIELD

The present invention relates to an electric generator, i.e. a device capable of generating an electric voltage (or electrical potential difference), and hence electrical energy, wherein electric charges are forced to move according to a uniform motion along a circuit.

BACKGROUND ART

Different types of electric generators are known, for example of a chemical, photovoltaic or solid state type.

A need is felt in the technical field of electric generators to make available a cost-saving source of energy with a low environmental impact, long capacity and durability, as well as capable of allowing generation of electrical energy in any closed or open environment, without the components constituting it being subject to oxidation or degradation if exposed to air.

Another need felt in the technical field of electric generators is that of allowing construction of compact, versatile electric generators which are suitable, even in their form, to the most disparate application needs.

It is an object of the present invention to meet these needs of the prior art, within a simple, rational and low-cost solution.

These objects are achieved by the features of the invention as claimed in the independent claims. The dependent claims outline preferred and/or particularly advantageous aspects of the invention.

DISCLOSURE OF THE INVENTION

The invention, particularly, makes available an electric generator (i.e. an electric voltage generator or a primary battery) which comprises:
a first layer based on a polyvinyl polymer;
a second layer made of graphite or graphene in contact with the first layer;
a first electrical contact connected to the first layer; and
a second electrical contact connected to the second layer.

Owing to this solution, the Applicant has surprisingly found that the first and second layer generate a difference in terms of electrical potential, substantially constant over a long period of time or in any case with a slow decay, which makes it possible to generate an electric current suitable for supplying an electrical load.

The generated electrical voltage is easily verifiable by applying the electrodes of a voltmeter to the first and second electrical contacts (kept isolated/separated from one another), thus detecting an electrical potential difference of about 0.72 V between the first layer and second layer of the generator.

Advantageously, the first layer may comprise or consist of polyvinylchloride (PVC) or polyvinyl alcohol (PVA).

Owing to this solution, such polyvinyl polymers, in addition to constituting an essential part of the generator for generating electrical voltage, define a first particularly versatile layer (flexible and/or at least partially elastic) suitable for multiple applications of the generator, for example suitable for fitting to the shape of a support or for maintaining the shape of the support where the latter is subject to deformation.

Furthermore, in order that workability of the first layer is improved, the first layer itself may comprise glycerol, preferably in an amount equal to 10% by volume of the polyvinyl polymer volume, and/or siliceous water, preferably in a quantity equal to 20% by volume of the polyvinyl polymer volume, and/or sodium bicarbonate, preferably in an amount equal to 5% by volume of the polyvinyl polymer volume.

In a preferred embodiment, the second layer may consist of a carbon monoatomic layer, referred to as graphene, which, improves efficiency and/or duration of the generator, for example.

Advantageously, the first layer may exhibit a thickness between 20 μm and 300 μm, preferably equal to 200 μm.

Indeed it was found that in the presence of high thicknesses of the first layer the electrical voltage generated by the generator is, so to speak, damped, thereby being a reduction of thickness of the first layer desirable, compatibly with the mechanical resistance thereof.

For the same purposes described above, the invention also makes available a system comprising a plurality of generators, each formed according to what has been described above, wherein said generators are mutually connected in series or in parallel.

Furthermore, for the same purposes described above, the invention provides a method of constructing an electric generator which comprises:
obtaining a first layer based on polyvinyl polymer;
coating a face of the first layer with a second layer comprised of graphite or graphene such that the second layer is in contact with the first layer;
connecting a first electrical contact to the first layer; and
connecting a second electrical contact to the second layer.

BRIEF DESCRIPTION OF THE DRAWINGS

Further characteristics and advantages of the invention will become apparent from the reading of the following description provided as a non-limiting example, with the aid of the figures illustrated in the attached tables.

FIG. 1 is a schematic axonometric view of an electric generator according to the invention.

FIG. 2 is a schematic view of a first embodiment of a system comprising a plurality of electric generators according to the invention.

FIG. 3 is a schematic view of a second embodiment of a system comprising a plurality of electric generators according to the invention.

BEST WAY TO IMPLEMENT THE INVENTION

With particular reference to these figures, by 10 it is generally indicated an electric generator, i.e. a voltage generator (or electric potential difference), in particular a "solid state electric generator", which generator—once inserted in a circuit 100 for example—is able to generate electricity.

The generator 10 comprises a first layer 11 (or film) made of (i.e. comprising or consisting of) a base of a polyvinyl polymer, for example selected from the group consisting of Polyvinylchloride (PVC) and Polyvinyl alcohol (PVA).

By the term base it is herein meant the main component whereof the first layer 11 is made, i.e. the component the first layer 11 consists of or which is between 51% and 100% by volume (or by weight) in the first layer 11.

The first layer 11 preferably, in addition to the polyvinyl polymer base, may also include glycerol, for example added to the polyvinyl polymer (PVA or PVC) in an amount equal to 10% by volume of the volume of the polyvinyl polymer itself.

Furthermore, in addition to the polyvinyl polymer base, the first layer 11 may further comprise NaHCO3 sodium bicarbonate, for example added to the polyvinyl polymer (PVA or PVC) in an amount equal to 5% by volume of the volume of polyvinyl polymer.

Furthermore, the first layer 11, in addition to the polyvinyl polymer base, may also comprise silica water, for example added to the polyvinyl polymer (PVA or PVC) in an amount equal to 20% by volume of the polyvinyl polymer volume.

Preferably, the first layer 11 is substantially flexible and/or at least partially elastic.

Furthermore, the first layer 11 exhibits a thickness comprised between 20 µm and 300 µm, preferably equal to 200 µm.

For example, the first layer 11 may have any shape, for example a plate-like shape with a quadrangular base (being rectangular in the illustrated example).

In this case, the first layer 11 comprises a first main face 110 (being the upper face in the figure) and a second main face 111, opposed to the first face 110 (in the direction of the thickness of the first layer 11 itself), which faces are substantially parallel one to another(and substantially smooth), for example.

The generator 10 further comprises a second layer 12 (or film) made of (i.e. comprising or consisting of) graphite or graphene (i.e. a monoatomic layer made of carbon atoms/or a monomeric graphite layer).

The second layer 12 is placed in direct contact with the first layer 11, (entirely) superimposed on (at least one portion of) it, for example.

Preferably, the second layer 12 is (fixedly) secured to the first layer 11, in practice, the first layer 11 and the second layer 12 define a one-piece body (a monolithic sandwich) i.e. movable, installable and/or which may be handled as a one-piece body (which is stable over time).

The second layer 12 is also substantially flexible and/or at least partially elastic.

The second layer 12 (and the first layer 11, for example) is free of any further crystalline mineral (as well as it is free of the ones described above, namely graphite/graphene), in particular it is free of quartz.

Furthermore, the second layer 12 exhibits a thickness comprised between 5 µm and 20 µm, preferably equal to 15 µm.

The second layer 12 may exhibit any shape, for example a plate-like shape with a quadrangular base (being rectangular in the illustrated example), preferably (but not limitedly) homologous to the shape (in plan) of the first layer 11.

In particular, the second layer 12 comprises a first main face 120 (being the upper face in the figure) and a second main face 121, opposed to the first face 120 (in the direction of the thickness of the second layer 12 itself), which faces are substantially parallel to one another (and substantially smooth), for example.

The second face 121 of the second layer 12 is in (direct) contact with the first face 110 of the first layer 11 and, for example, it adheres (inseparably) thereto.

The overall thickness of the (sandwich) body defined by the joining of the first layer 11 and second layer 12 is substantially between 50 µm and 200 µm, preferably equal to 100 µm.

The generator 10 further comprises a first electrical contact 13 connected to the first layer 11, for example fixed thereto or in any case placed in contact with the first layer 11, preferably with the second (free) face 111 of the first layer 11 itself.

The first electrical contact 13 is defined by a metallic (or in any case electrically conductive) body, for example a plate-shaped or in any case a configured body.

The first electrical contact 13 may be substantially flexible.

The generator 10 further comprises a second electrical contact 14 connected to the second layer 12, for example fixed thereto or in any case placed in contact with the second layer 12, preferably with the first (free) face 120 of the second layer 12 itself.

The second electrical contact 14 is also defined by a metal body (or in any case a body of the electrically conductive type), for example a plate-shaped or in any case a configured, preferably flexible body.

The generator 10 may be arranged inside a container (wherefrom only the end portions of the first electrical contact 13 and second electrical contact 14 are protruding), which container may also not be hermetic, or the generator may be free of any container i.e. it may come to be in any environmental conditions, in that neither the first layer 11 nor the second layer 12 as described above are subject to oxidation in the air.

The circuit 100 schematically comprises an electrical load 20, which is connected to the first electrical contact 13 and to the second electrical contact 14, for example by suitable wiring, and is electrically powered by the electrical voltage (i.e. electrical potential difference) produced by the generator 10, i.e. by the first layer 11 and second layer 12 thereof.

The electrical load 20 may be any electric supply, such as for example a light source, an electric charge accumulator, an electric/electronic device or the like.

The circuit 100, as schematically illustrated in FIGS. 2 and 3, might be included in a system which comprises a plurality of generators 10, as described above, which may be connected to each other—via their first electrical contacts 13 and second electrical contacts 14—in series (see FIG. 2) or in parallel (see FIG. 3). In light of the foregoing, one embodiment of the generator 10 according to the invention is as follows.

The method, according to the invention, may comprise making the first layer 11 based on a polyvinyl polymer (for example PVC or PVA).

To do this, a compound is obtained by mixing it in a mixer which compound is formed from the selected polyvinyl polymer (PVC or PVA), to which a metered quantity of glycerol, (equal to 10% by volume relative to the polyvinyl polymer volume), one any metered quantity of silicon water (equal to 20% by volume relative to the volume of the polyvinyl polymer) and one any metered quantity of sodium bicarbonate (equal to 5% by volume relative to the volume of the polyvinyl polymer) are possibly added.

The compound thus mixed is spread to form a homogeneous layer of the desired thickness (for example comprised between 20 µm and 300 µm, preferably equal to 200 µm), by way of a forming method whatsoever, for example by way of a squeegee acting on a calibrated track provided with a forming alveolus of the first layer 11.

The compound thus spread and formed is then consolidated (baked/dried), preferably by heating (using infrared lamps), for example at a temperature between 35° C. and 45° C. (approximately equal to 40° C.) for a time interval comprised between 6 hours and 8 hours (preferably equal to 6 hours), or by cross-linking of the polyvinyl polymer.

The consolidated compound defines the first layer 11 mentioned above.

Thereafter, the method envisages making the second layer 12 comprised of graphite or graphene and coating the first face 110 of the first layer 11 with the second layer 12, such that the second layer 12 is in contact with the first layer 11.

In practice, in order that the second layer 12 is obtained it is possible to proceed by having a graphite and/or graphene layer (for example a preformed layer) available or by forming a graphite and/or graphene layer directly on the first face 110 of the first layer 11.

For example, based on this second hypothesis, it is possible to proceed with having a quantity of graphite powder, wherein the graphite powder exhibits a grain size of between 0.1 µm and 20 µm, preferably equal to 5 µm, for example.

The graphite powder is then added in suspension to an easily evaporable and non-solvent mixing fluid intended for the polyvinyl polymer, which polyvinyl polymer is used to make the first layer 11, for example alcohol (e.g. pure alcohol, comprised of 99% ethanol for example), with such suspension being preferably kept stirred by a (mechanical) stirrer.

The (alcohol suspension) made of graphite powder is then deposited, for example by way of any deposition method (such as brush and/or spray applications or any other suitable deposition technique), onto the first face 110 of the first previously formed layer 11, to thus form a homogeneous layer of the desired thickness (for example between 2 µm and 10 µm, preferably equal to 5 µm) of graphite powder and/or a layer made of graphene applied thereon (i.e. on the entire surface of the first face 110 or on portions thereof).

The graphite and/or graphene powder thus deposited and formed is dried by making the mixing liquid to evaporate, preferably via heating (making use of an oven or infrared lamps), for example at a temperature between 30° C. and 35° C. (approximately equal to 32° C.) for a time interval comprised between 20 min and 30 min (approximately equal to 25 min).

At this stage the second layer 12 is formed and firmly fixed to the first layer 11, i.e. it is made thoroughly adherent thereto due to mutual adhesive contact between the first face 110 of the first layer 11 and the second face 121 of the second layer 12.

In order that construction of the generator 10 is completed, the construction method provides for connecting the first electrical contact 13, for example previously formed, to the first layer 11, or to the second face 111 thereof, and connecting the second electrical contact 14, for example previously formed, to the second layer 12, or the first face 120 thereof.

The invention thus conceived is susceptible of numerous modifications and variations, all of which are within the scope of the inventive concept.

Furthermore all details may be replaced by other technically equivalent elements.

In practice, the materials used, as well as the contingent shapes and dimensions, may be any according to requirements without thereby departing from the scope of protection of the following claims.

The invention claimed is:

1. An electric generator comprising:
    a first layer based on a polyvinyl polymer;
    a second layer made of graphite or graphene in contact with the first layer;
    a first electrical contact connected to the first layer; and
    a second electrical contact connected to the second layer.

2. The electric generator according to claim 1, wherein the first layer comprises Polyvinylchloride (PVC).

3. The electric generator according to claim 1, wherein the first layer comprises Polyvinyl Alcohol (PVA).

4. The electric generator according to claim 1, wherein the first layer further comprises glycerol, preferably in an amount equal to 10% by volume of the volume of polyvinyl polymer.

5. The electric generator according to claim 1, wherein the first layer further comprises siliceous water, preferably in an amount equal to 20% by volume of the volume of polyvinyl polymer.

6. The electric generator according to claim 1, wherein the first layer further comprises sodium bicarbonate, preferably in an amount equal to 5% by volume of the volume of polyvinyl polymer.

7. The electric generator according to claim 1, wherein the second layer is a carbon monoatomic layer, referred to as graphene.

8. The electric generator according to claim 1, wherein a face of the second layer adheres to a face of the first layer.

9. The electric generator according to claim 1, the first layer exhibiting a thickness comprised between 20 µm and 300 µm, preferably equal to 200 µm.

10. The electric generator according to claim 1, wherein the graphite exhibits a grain size comprised between 0.1 µm and 20 µm.

11. A system comprising a plurality of the generators disclosed in claim 1 wherein the generators are connected together in series or in parallel.

12. A method of constructing an electric generator comprising:
    making a first layer based on polyvinyl polymer;
    coating a face of the first layer with a second layer comprised of graphite or graphene so that the second layer is in contact with the first layer;
    connecting a first electrical contact to the first layer; and
    connecting a second electrical contact to the second layer.

* * * * *